United States Patent [19]
Finol et al.

[11] Patent Number: 5,942,939
[45] Date of Patent: Aug. 24, 1999

[54] AMPLIFIER AND METHOD OF CANCELING DISTORTION BY COMBINING HYPERBOLIC TANGENT AND HYPERBOLIC SINE TRANSFER FUNCTIONS

[75] Inventors: Jesus L. Finol, Gilbert; David K. Lovelace, Chandler, both of Ariz.

[73] Assignee: Motorola, Inc., Schaumburg, Ill.

[21] Appl. No.: 09/088,002

[22] Filed: Jun. 1, 1998

[51] Int. Cl.$^6$ .................................................. H03F 1/26
[52] U.S. Cl. ........................ 330/149; 330/252; 330/295
[58] Field of Search .............................. 330/149, 124 R, 330/252, 295; 375/296, 297; 327/563, 89, 52, 66

[56] References Cited

U.S. PATENT DOCUMENTS

| | | | |
|---|---|---|---|
| 4,095,196 | 6/1978 | Seidel | 332/16 T |
| 4,392,252 | 7/1983 | Cluniat | 455/116 |
| 4,529,946 | 7/1985 | Kusakabe | 330/257 |
| 5,406,223 | 4/1995 | Vulih | 330/258 |
| 5,815,039 | 9/1998 | Kimura | 330/252 |

*Primary Examiner*—Benny Lee
*Assistant Examiner*—Henry Choe
*Attorney, Agent, or Firm*—Robert D. Atkins

[57] ABSTRACT

A differential amplifier (10) receives a differential input signal ($V_{IN}$). The input signal is attenuated by a first attenuator (12) and applied to a tan h amplifier (16). The input signal is also attenuated by a second attenuator (14) and applied to a sin h amplifier (18). The input signals to the tan h amplifier and sin h amplifier are independently attenuated. The transfer functions of the tan h amplifier and the sin h amplifier each have a linear region and a non-linear region. The output of the tan h amplifier and the sin h amplifier are summed (26) so that the non-linear region of the tan h amplifier cancels with the non-linear region of the sin h amplifier. The overall transfer function of the differential amplifier is linear over a wide range of input signal amplitudes by the cancellation of the non-linear regions.

20 Claims, 2 Drawing Sheets

AMPLIFIER AND METHOD OF CANCELING DISTORTION BY COMBINING HYPERBOLIC TANGENT AND HYPERBOLIC SINE TRANSFER FUNCTIONS

BACKGROUND OF THE INVENTION

The present invention relates in general to amplifiers and, more particularly, to an amplifier which combines a hyperbolic tangent transfer function with a hyperbolic sine transfer function to cancel distortion.

Amplifiers are commonly used in a myriad of applications to amplify an input signal and provide an amplified output signal. Amplifiers are often differential in operation. Typically end applications for differential amplifiers include radio frequency (RF) transceivers, cellular telephones, pagers, cordless telephones, filters, and other wireless communication equipment.

An important feature of differential amplifiers is to maintain linear operation over a wide range of input signal amplitudes. When operating in its linear range, a differential amplifier provides an output signal proportional to the input signal, where the proportionality is determined by the gain of the amplifier. Most prior art differential amplifiers operate linearly over a narrow range of input signal amplitudes. If the amplifier operates outside its linear range, then the output signal is subject to non-linear distortion and noise.

One prior art technique of increasing the linear range of the differential amplifier involves placing degeneration resistors in the emitters of the differential transistor pair. Unfortunately, the degeneration resistors also have the undesirable effect of decreasing the gain of the differential amplifier and increasing the noise figure.

Hence, a need exists for a differential amplifier having linear operation over a wide range of input signals with high gain and low noise figure.

DETAILED DESCRIPTION OF THE PREFERRED EMBODIMENT

Figure 1:
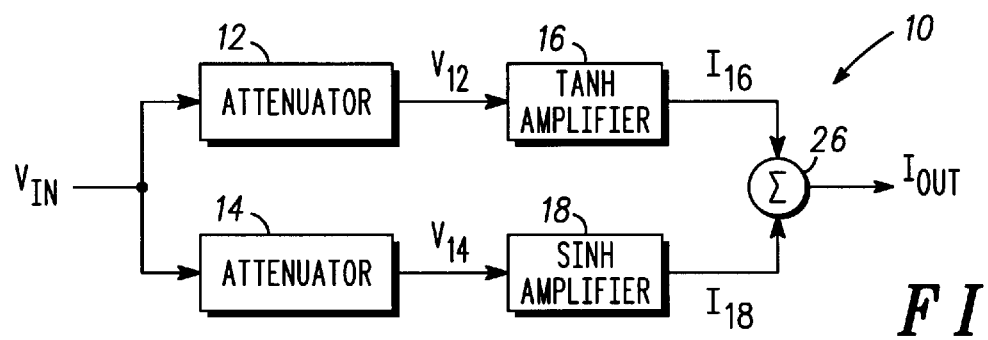
FIG. 1 illustrates a block diagram of an amplifier combining a hyperbolic tangent and hyperbolic sine transfer functions.

Referring to FIG. 1, an amplification circuit 10 is shown suitable for manufacturing as an integrated circuit using conventional integrated circuit processes. An input signal $V_{IN}$ is applied to attenuators 12 and 14, which in turn provide attenuated input signals $V_{12}$ and $V_{14}$. The input signals $V_{12}$ and $V_{14}$ are thus independently attenuated. The attenuated input signal $V_{12}$ is processed through hyperbolic tangent (tan h) amplifier 16. The transconductance transfer function of amplifier 16 is shown as waveform 20 in FIG. 2 following a tan h function with a linear region and a non-linear region. The attenuated input signal $V_{14}$ is processed through hyperbolic sine (sin h) amplifier 18. The transconductance transfer function of amplifier 18 is shown as waveform 22 in FIG. 2 following a sin h function with a linear region and a non-linear region. The output current $I_{16}$ of tan h amplifier 16 and the output current $I_{18}$ of sin h amplifier 18 flow into the inputs of summation node 26. Summation node 26 combines or sums the output currents of amplifiers 16 and 18 and provides output current $I_{OUT}=I_{16}+I_{18}$.

Figure 2:
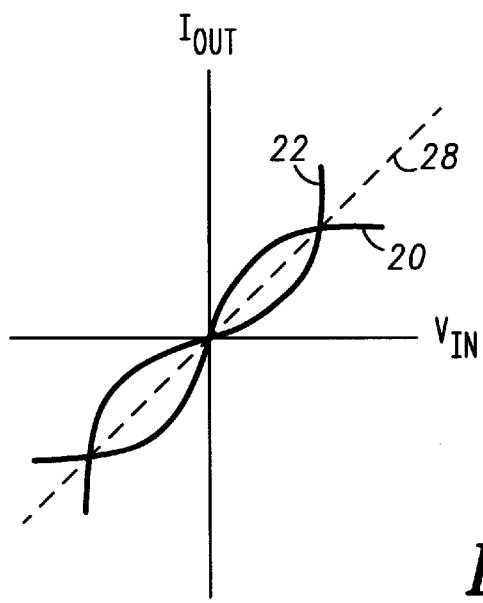
FIG. 2 is a waveform plot useful in the explanation of the present invention.

The overall transconductance transfer function of amplification circuit 10 is shown as waveform plot 28 in FIG. 2 as the sum of waveform plot 20 and waveform plot 22. The non-linear region of waveform plot 20 cancels with the non-linear region of waveform plot 22. The transconductance gain $I_{OUT}/V_{IN}$ of amplification circuit 10 which combines the output of a tan h amplifier and the output of a sin h amplifier is linear over a wider range of input signals $V_{IN}$ than can be obtained with a tan h amplifier, or a sin h amplifier alone.

In an alternate embodiment, the combination of output currents $I_{16}$ and $I_{18}$ could be accomplished by other means provided the non-linear region of the tan h transfer function cancels with the non-linear region of the sin h transfer function. Also, as discussed below, it is desirable in some applications to have attenuators 12 and 14 be adjustable.

Figure 3:
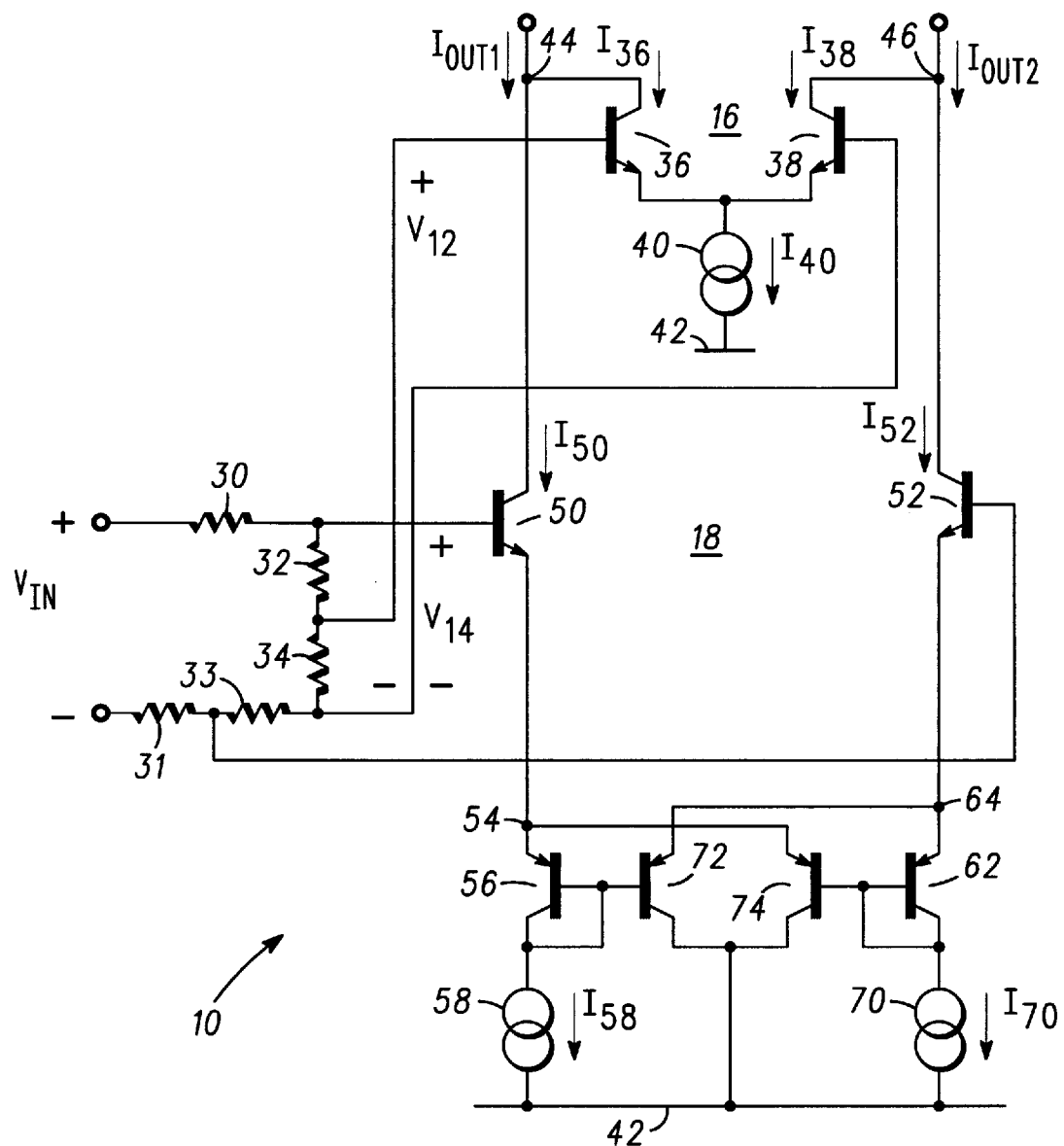
FIG. 3 is a schematic diagram of a differential amplifier according to FIG. 1.

Turning to FIG. 3, further detail of attenuators 12 and 14 and tan h amplifier 16 and sin h amplifier 18 are shown in a differential configuration. The differential input signal $V_{IN}$, on the order of 1 volt, is applied to resistor divider network 30, 31, 32, 33, and 34. The voltage across resistor 34 represents attenuated voltage $V_{12}$ and the voltage across resistors 32, 33, and 34 represents attenuated voltage $V_{14}$. Other attenuator circuits which attenuate an input signal may be substituted for resistor divider network 30–34.

Amplifier 16 has a hyperbolic tangent transconductance transfer function. Tan h amplifier 16 includes differential transistors 36 and 38. Current source 40 is referenced to power supply conductor 42 operating at ground potential. The collector of transistor 36 is coupled to node 44, and the collector of transistor 38 is coupled to node 46. Nodes 44 and 46 are the combination circuit or summation nodes at the first and second outputs of the differential amplifier 10 which combine the input currents flowing into the summation nodes.

As the voltage at the base of transistor 36 increases and the voltage at the base of transistor 38 decreases differentially, the current $I_{36}$ increases and the current $I_{38}$ decreases. Alternately, as the voltage at the base of transistor 36 decreases and the voltage at the base of transistor 38 increases differentially, the current $I_{36}$ decreases and the current $I_{38}$ increases. The sum of currents $I_{36}$ and $I_{38}$ remains equal to current $I_{40}$.

Tan h amplifier 16 has a transconductance transfer function as shown in waveform 20 in FIG. 2 and given as:

$$I_{DIFF1} = I_{40} * \tan h\ (V_{IN}/2V_t) \qquad (1)$$

where:

$I_{DIFF1}=I_{36}-I_{38}$ $V_t$ is the transistor thermal threshold voltage (25 millivolts at 25° C.)

The current $I_{40}$ is adjustable to control the slope of waveform plot 20 and associated gain of amplifier 16.

Amplifier 18 has a hyperbolic sine transconductance transfer function. Sin h amplifier 18 includes transistors 50 and 52. The collectors of transistors 50 and 52 are coupled to summation nodes 44 and 46, respectively. As the voltage at the base of transistor 50 increases, the emitter voltage of transistor 50 at node 54 increases accordingly. Transistor 56 conducts a current $I_{58}$ determined by current source 58. As the voltage at node 54 increases, the voltage on the base of transistor 56 must increase to maintain the base-emitter voltage ($V_{be}$) of transistor 56 such that transistor 56 continues conducting current $I_{58}$.

The voltage at the base of transistor 52 is decreasing as the voltage at the base of transistor 50 is increasing. The emitter voltage of transistor 52 at node 64 decreases accordingly. Transistor 62 conducts a current $I_{70}$ determined by current source 70. As the voltage at node 64 decreases, the voltage on the base of transistor 62 must decrease to maintain the $V_{be}$ of transistor 62 such that transistor 62 continues conducting current $I_{70}$. With the base voltage of transistor 72 increasing and the base voltage of transistor 74 decreasing, transistor 72 conducts less current and transistor 74 conducts more current. Transistor 50 conducts current $I_{50}$ equal to current $I_{58}$ plus the current flowing through transistor 74. Transistor 52 conducts current $I_{52}$ equal to current $I_{70}$ plus the current flowing through transistor 72. Accordingly, the current $I_{50}$ increases and the current $I_{52}$ decreases in response to the differential input signal.

As the voltage at the base of transistor 50 decreases, the emitter voltage of transistor 50 at node 54 decreases accordingly. As the voltage at node 54 decreases, the voltage on the base of transistor 56 must decrease to maintain the $V_{be}$ of transistor 56 such that transistor 56 continues conducting current $I_{58}$. The voltage at the base of transistor 52 is increasing as the voltage at the base of transistor 50 is decreasing. The emitter voltage of transistor 52 at node 64 increases accordingly. As the voltage at node 64 increases, the voltage on the base of transistor 62 must increase to maintain the $V_{be}$ of transistor 62 such that transistor 62 continues conducting current $I_{70}$. With the base voltage of transistor 72 decreasing and the base voltage of transistor 74 increasing, transistor 72 conducts more current and transistor 74 conducts less current. The current $I_{50}$ decreases and the current $I_{52}$ increases in response to the differential input signal.

Sin h amplifier 18 has a transconductance transfer function as shown in waveform 22 in FIG. 2 and given as:

$$I_{DIFF2}=2*I_{58}*\sin h\ (V_{IN}/2V_t) \quad (2)$$

where:

$I_{DIFF2}=I_{50}-I_{52}\ I_{58}$ is equal to $I_{70}$

The currents $I_{58}$ and $I_{70}$ are adjustable to control the slope of waveform plot 22 and associated gain of amplifier 18.

The currents $I_{58}$ and $I_{52}$ flow into summation nodes 44 and 46, respectively. Thus, the output current $I_{OUT1}=I_{36}+I_{50}$ and the output current $I_{OUT2}=I_{38}+I_{52}$. The output current $I_{OUT}$ of amplification circuit 10 in FIG. 1 is given as $I_{OUT}=I_{OUT1}-I_{OUT2}$, or equivalently:

$$I_{OUT}=A\tan h\ (B*V_{IN})+C\sin h\ (D*V_{IN}) \quad (3)$$

$$=I_{40}*\tan h\ (B*V_{IN}/2V_t)+2*I_{58}*\sin h\ (D*V_{IN}/2V_t) \quad (4)$$

where:

A is determined by $I_{40}$

B is determined by attenuator 12

C is determined by $I_{58}$

D is determined by attenuator 14

The parameters A, B, C, and D are adjustable to maximize the linear operating range of input signal $V_{IN}$. In one example, the currents $I_{40}$, $I_{58}$, and $I_{70}$ are each set to values between 100 microamps to 1 milliamp. The parameters B is set to a value of 0.5 and the parameter D is set to a value of 0.9. By combining the operation of the tan h amplifier and the sin h amplifier and summing the result, the range of linear operation for the input signal increases.

In summary, the present invention provides a differential amplifier including a tan h amplifier and a sin h amplifier each receiving an input signal. The input signals to the tan h amplifier and sin h amplifier are independently attenuated. The transfer functions of the tan h amplifier and the sin h amplifier each have a linear region and a non-linear region. The output of the tan h amplifier and the sin h amplifier are summed so that the non-linear region of the tan h amplifier cancels with the non-linear region of the sin h amplifier. The overall transfer function of the differential amplifier is linear over a wide range of input signal amplitudes by the cancellation of the non-linear regions.

What is claimed is:

1. An amplification circuit having an input coupled for receiving an input signal and having an output for providing an output signal, comprising:

a first amplifier having an input coupled for receiving the input signal, wherein the first amplifier has a hyperbolic tangent transconductance transfer function;

a second amplifier having an input coupled for receiving the input signal, wherein the second amplifier has a hyperbolic sine transconductance transfer function; and a combining circuit, having a first input coupled to an output of the first amplifier, a second input coupled to an output of the second amplifier, and an output for providing the output signal of the amplification circuit.

2. The amplification circuit of claim 1 further including:

a first attenuator having an input coupled for receiving the input signal and an output coupled to the input of the first amplifier; and a second attenuator having an input coupled for receiving the input signal and an output coupled to the input of the second amplifier.

3. The amplification circuit of claim 1 wherein the combining circuit includes first and second summation nodes at first and second outputs of the amplification circuit.

4. The amplification circuit of claim 3 wherein the first amplifier includes:

a first transistor having a first conduction terminal coupled to the first summation node and a control terminal coupled for receiving a first component of the input signal;

a second transistor having a first conduction terminal coupled to the second summation node and a control terminal coupled for receiving a second component of the input signal; and a current source having an output coupled to a second conduction terminal of the first transistor and further coupled to a second conduction terminal of the second transistor.

5. The amplification circuit of claim 4 wherein the current source is adjustable to control gain of the first amplifier.

6. The amplification circuit of claim 4 wherein the second amplifier includes first and second outputs coupled to the first and second summation nodes, respectively.

7. The amplification circuit of claim 3 wherein the second amplifier includes:

a first transistor having a first conduction terminal coupled to the first summation node and a control terminal coupled for receiving a first component of the input signal;

a second transistor having a first conduction terminal coupled to the second summation node and a control terminal coupled for receiving a second component of the input signal;

a third transistor having a first conduction terminal coupled to a second conduction terminal of the first transistor, and a second conduction terminal coupled to a control terminal of the third transistor;

a fourth transistor having a first conduction terminal coupled to a second conduction terminal of the second transistor, a second conduction terminal coupled to a first power supply conductor, and a control terminal coupled to the control terminal of the third transistor; and a first current source having an output coupled to the second conduction terminal of the third transistor.

8. The amplification circuit of claim 7 wherein the second amplifier further includes:

a fifth transistor having a first conduction terminal coupled to the second conduction terminal of the second transistor, and a second conduction terminal coupled to a control terminal of the fifth transistor;

a sixth transistor having a first conduction terminal coupled to the second conduction terminal of the first transistor, a second conduction terminal coupled to the first power supply conductor, and a control terminal coupled to the control terminal of the fifth transistor; and a second current source having an output coupled to the second conduction terminal of the fifth transistor.

9. The amplification circuit of claim 8 wherein the first and second current sources are adjustable to control gain of the first and second amplifiers.

10. The amplification circuit of claim 8 wherein the first amplifier includes first and second outputs coupled to the first and second summation nodes.

11. A differential amplifier having first and second inputs coupled for receiving a differential input signal and having first and second outputs for providing a differential output signal, comprising:

first and second summation nodes at first and second outputs of the differential amplifier;

a hyperbolic tangent (tan h) amplifier having first and second inputs coupled for receiving the differential input signal and first and second outputs respectively coupled to the first and second summation nodes; and a hyperbolic sine (sin h) amplifier having first and second inputs coupled for receiving the differential input signal and first and second outputs respectively coupled to the first and second summation nodes.

12. The differential amplifier of claim 11 wherein the tan h amplifier includes:

a first transistor having a first conduction terminal coupled to the first summation node and a control terminal coupled for receiving a first component of the differential input signal;

a second transistor having a first conduction terminal coupled to the second summation node and a control terminal coupled for receiving a second component of the differential input signal; and a current source having an output coupled to a second conduction terminal of the first transistor and further coupled to a second conduction terminal of the second transistor.

13. The differential amplifier of claim 11 wherein the sin h amplifier includes:

a first transistor having a first conduction terminal coupled to the first summation node and a control terminal coupled for receiving a first component of the differential input signal;

a second transistor having a first conduction terminal coupled to the second summation node and a control terminal coupled for receiving a second component of the differential input signal;

a third transistor having a first conduction terminal coupled to a second conduction terminal of the first transistor, and a second conduction terminal coupled to a control terminal of the third transistor;

a fourth transistor having a first conduction terminal coupled to a second conduction terminal of the second transistor, a second conduction terminal coupled to a first power supply conductor, and a control terminal coupled to the control terminal of the third transistor;

a first current source having an output coupled to the second conduction terminal of the third transistor;

a fifth transistor having a first conduction terminal coupled to the second conduction terminal of the second transistor, and a second conduction terminal coupled to a control terminal of the fifth transistor;

a sixth transistor having a first conduction terminal coupled to the second conduction terminal of the first transistor, a second conduction terminal coupled to the first power supply conductor, and a control terminal coupled to the control terminal of the fifth transistor; and a second current source having an output coupled to the second conduction terminal of the fifth transistor.

14. A method of amplifying an input signal and providing an output signal, comprising the steps of:

amplifying the input signal according to a hyperbolic tangent transfer function to provide a first amplified signal;

amplifying the input signal according to a hyperbolic sine transfer function to provide a second amplified signal; and combining the first and second amplified signals to cancel distortion in the output signal imposed by the hyperbolic tangent transfer function and by the hyperbolic sine transfer function.

15. The method of claim 14 further including the step of attenuating the input signal before the amplifying steps.

16. The method of claim 14 wherein the step of combining includes the step of summing the first amplified signal with the second amplified signal to cancel distortion in the output signal.

17. An amplifier, comprising:

a hyperbolic tangent (tan h) amplifier having an input coupled for receiving an input signal;

a hyperbolic sine (sin h) amplifier having an input coupled for receiving the input signal; and a summation circuit having a first input coupled to an output of the tan h amplifier, a second input coupled to an output of the sin h amplifier, and an output for providing an output signal of the amplifier.

18. The amplifier of claim 17 further including:

a first attenuator having an input coupled for receiving the input signal and an output coupled to the input of the tan h amplifier; and a second attenuator having an input coupled for receiving the input signal and an output coupled to the input of the sin h amplifier.

19. The amplifier of claim 17 wherein the tan h amplifier includes:

a first transistor having a first conduction terminal coupled to the first input of the summation circuit and a control terminal coupled for receiving a first component of the input signal;

a second transistor having a first conduction terminal coupled to the second input of the summation circuit and a control terminal coupled for receiving a second component of the input signal; and a current source having an output coupled to a second conduction terminal of the first transistor and further coupled to a second conduction terminal of the second transistor.

20. The amplifier of claim 17 wherein the sin h amplifier includes:

a first transistor having a first conduction terminal coupled to the first input of the summation circuit and a control terminal coupled for receiving a first component of the input signal;

a second transistor having a first conduction terminal coupled to the second input of the summation circuit and a control terminal coupled for receiving a second component of the input signal;

a third transistor having a first conduction terminal coupled to a second conduction terminal of the first transistor, and a second conduction terminal coupled to a control terminal of the third transistor;

a fourth transistor having a first conduction terminal coupled to a second conduction terminal of the second transistor, a second conduction terminal coupled to a first power supply conductor, and a control terminal coupled to the control terminal of the third transistor;

a first current source having an output coupled to the second conduction terminal of the third transistor;

a fifth transistor having a first conduction terminal coupled to the second conduction terminal of the second transistor, and a second conduction terminal coupled to a control terminal of the fifth transistor;

a sixth transistor having a first conduction terminal coupled to the second conduction terminal of the first transistor, a second conduction terminal coupled to the first power supply conductor, and a control terminal coupled to the control terminal of the fifth transistor; and a second current source having an output coupled to the second conduction terminal of the fifth transistor.

\* \* \* \* \*